(12) United States Patent
Lee (10) Patent No.: US 7,796,440 B2
(45) Date of Patent: Sep. 14, 2010

(54) NAND FLASH MEMORY DEVICE AND METHOD OF PROGRAMMING THE SAME

(75) Inventor: Chang-Hyun Lee, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 113 days.

(21) Appl. No.: 12/222,264

(22) Filed: Aug. 6, 2008

(65) Prior Publication Data
US 2009/0040836 A1    Feb. 12, 2009

(30) Foreign Application Priority Data
Aug. 9, 2007    (KR) ............... 10-2007-0080151

(51) Int. Cl.
*G11C 16/06* (2006.01)
(52) U.S. Cl. .................... 365/185.22; 365/185.17; 365/185.12; 365/185.14
(58) Field of Classification Search ............ 365/185.22, 365/185.17, 185.12, 185.14
See application file for complete search history.

(56) References Cited

U.S. PATENT DOCUMENTS

| 5,467,309 | A | 11/1995 | Tanaka et al. |
| 2005/0185468 | A1* | 8/2005 | Hosono et al. ......... 365/185.22 |
| 2006/0015687 | A1* | 1/2006 | Kim et al. ................ 711/128 |
| 2006/0104112 | A1* | 5/2006 | Hosono et al. ......... 365/185.01 |

FOREIGN PATENT DOCUMENTS

| KR | 10-1996-0035647 | 10/1996 |
| KR | 10-2006-0059282 | 6/2006 |
| KR | 10-2006-0122590 | 11/2006 |

\* cited by examiner

*Primary Examiner*—Thong Q Le
(74) *Attorney, Agent, or Firm*—Harness, Dickey & Pierce, P.L.C.

(57) ABSTRACT

Provided are a NAND flash memory device and a method of programming the same. The NAND flash memory device may include a cell array including a plurality of pages; a page buffer storing program data of the pages; a data storage circuit providing program verification data to the page buffer; and a control unit. The control unit may program the pages and verify the pages using the program verification data following the programming of at least two of the pages.

24 Claims, 10 Drawing Sheets

NAND FLASH MEMORY DEVICE AND METHOD OF PROGRAMMING THE SAME

PRIORITY STATEMENT

This U.S. non-provisional patent application claims priority under 35 U.S.C. §119 of Korean Patent Application No. 10-2007-0080151, filed on Aug. 9, 2007, the entire contents of which are hereby incorporated by reference.

BACKGROUND

1. Field

Example embodiments relate to a semiconductor memory device. More particularly, example embodiments relate to a NAND flash memory device and a method of programming the same.

2. Description of Related Art

A semiconductor memory device is a kind of a memory device capable of storing data therein as well as reading the stored data. Semiconductor memory devices are largely classified as a random access memory (RAM) or a read only memory (ROM). The RAM is a volatile memory device in which stored data disappears or is lost when there is no power supply and/or power supplied to the RAM is interrupted. The ROM is a non-volatile memory device in which stored data remains and/or is maintained even when there is no power supply and/or power supplied to the ROM is interrupted. Examples of RAM include a dynamic RAM (DRAM), a static RAM (SRAM), etc. Examples of ROM include a programmable ROM (PROM), an erasable PROM (PROM), an electrically EPROM (EEPROM), a flash memory device, etc. Further, flash memory devices may be further classified as a NOR type or a NAND type flash memory device, for example.

Memory cells of a non-volatile memory device respectively have charge storage layers. In general, the charge storage layer employs a floating gate method using a conductor, or a charge trap method using an insulating material. A state in which charges are not stored in a charge storage layer may be referred to as logic 1 and may indicate that no data is stored in the memory cells or that the memory cells have been erased. Also, a state in which charges are stored in a charge storage layer may be referred to as logic 0 and may indicate data is stored in the memory cells or that the memory cells have been programmed.

A program operation is an operation for storing charges in a charge storage layer of a memory cell. However, the charges stored in the charge storage layer through a program operation may be in an unstable state for a time interval or duration following the programming operation. Especially, a flash memory device (e.g., a charge trap flash (CTF) memory device) using charge trap through a charge storage layer requires a time interval or duration until the programmed charges become stable. That is, a threshold voltage of a programmed memory cell may be in an unstable state for a time interval or duration after being programmed. It may take a time interval or duration after being programmed to indicate an accurate level once a threshold voltage of a memory cell becomes stable.

Accordingly, if a verify operation is performed right after a memory cell is programmed, errors may occur due to an unstable threshold voltage. If the threshold voltage is recognized lower than an accurate level, a memory cell that should pass the verifying operation may incorrectly be determined as failing the verifying operation. In this case, the memory cell is excessively programmed. On the contrary, if the threshold voltage is recognized higher than the accurate level, a memory cell that should fail the verifying operation may be incorrectly identified as passing the verifying operation. In this case, the memory cell is less moderately programmed. Therefore, threshold voltage distribution of a memory cell expands.

SUMMARY

Example embodiments provide a NAND flash memory device performing a verifying operation after a threshold voltage of a programmed memory cell becomes stable and a method of programming the same.

Example embodiments provide NAND flash memory devices. The NAND flash memory devices may include a cell array including a plurality of pages, a page buffer storing program data of the pages, a data storage circuit providing program verification data to the page buffer; and a control unit.

According to an example embodiment, the control unit may initially program the pages without performing a verifying operation and then perform a verifying operation on the pages by using the program verification data.

According to an example embodiment, the control unit programs the pages and verifies the programming of the pages using the program verification data following the programming of at least two of the pages.

According to an example embodiment, the program data are stored in the page buffer via the data storage circuit.

According to an example embodiment, the control unit continuously programs and then verifies the programmed pages.

According to an example embodiment, the control unit increases a program voltage and repeats the programming and verifying operations if at least one of the pages fails the verifying operation.

According to an example embodiment, the program verification data may be stored in the data storage circuit and may be updated based on a result of the verifying operation.

According to an example embodiment, the control unit verifies and then programs each of the pages after continuously programming the pages.

According to an example embodiment, when program fail occurs during the program verify process, the control unit increases a programming voltage and repeats the verifying and programming operations if one of the programmed pages fails the verifying operation.

According to an example embodiment, the data storage circuit stores the program data inputted from an external source and/or device and provides the program data to the page buffer substantially simultaneously.

According to an example embodiment, the data storage circuit has the same structure as the page buffer.

According to an example embodiment, the data storage circuit includes a plurality of registers.

Another example embodiment provides a method of programming a NAND flash memory device. The method may include programming a plurality of pages without a verifying operation; and then verifying the programmed pages.

Still another example embodiment provides a method of programming a NAND flash memory device. The method may include programming a plurality of pages and verifying the programmed pages following the programming of at least two of the plurality of pages.

According to an example embodiment, the program verifying operation is continuously performed on the pages.

According to an example embodiment, a time for performing the programming and verifying operation is longer than a time interval for a threshold voltage of a programmed memory cell to stabilized following programming.

According to an example embodiment, the number of pages is determined according to the time for performing the programming and verifying operation or the time interval for a threshold voltage of a memory cell to stabilize after programming.

According to an example embodiment, the plurality of pages includes a virtual page. The virtual page will always be determined to pass the verifying operation.

According to an example embodiment, a method may further include increasing a program voltage and repeating the programming and verifying operations if a programmed page fails the verifying operation.

According to an example embodiment, the method may further include repeating the programming and verifying operations on a page that has passed the verifying operation.

According to an example embodiment, a program method may be performed on a most significant bit and a least significant bit of a multi level cell.

According to an example embodiment, the method may further include determining a first verify voltage as a voltage lower than a threshold voltage required in a programmed memory cell; programming the pages through the first verify voltage; determining a second verify voltage as a voltage identical to a threshold voltage required in the programmed memory cell; and repeatedly programming the pages through the second verify voltage.

According to an example embodiment, the method may further include determining a first voltage that is lower than a threshold voltage associated with a programmed memory cell, verifying the programmed memory cell with the determined first verify voltage, determining a second voltage that is equal to or greater than a sum of a programming voltage used to program the plurality of pages and the first voltage, and repeatedly programming the pages with the second voltage.

Still another example embodiment provides a memory system. The memory system may include a NAND flash memory device; and a memory controller controlling the NAND flash memory device. The NAND flash memory device may include a cell array including a plurality of pages, a page buffer storing program data of the pages, a data storage circuit providing program verify data to the page buffer, and a control unit programming the pages without a program verify operation and performing a program verify operation on the pages by using the program verify data.

BRIEF DESCRIPTION OF THE FIGURES

The accompanying figures are included to provide a further understanding of example embodiments, and are incorporated in and constitute a part of this disclosure. The drawings illustrate example embodiments and, together with the detailed description, serve to explain advantages, principles and scope of this disclosure. In the figures.

DETAILED DESCRIPTION OF EXAMPLE EMBODIMENTS

Various example embodiments will now be described more fully with reference to the accompanying figures. However, specific structural and functional details disclosed herein are merely representative for purposes of describing example embodiments, and one skilled in the art will appreciate that example embodiments may be embodied in many alternate forms and should not be construed as limited to only the embodiments set forth herein.

It should be understood that, although the terms first, second, etc. are used herein to describe various elements, these elements should not be limited by these terms. These terms are only used to distinguish one element from another. For example, a first element could be termed a second element, and similarly, a second element could be termed a first element, without departing from the scope of this disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (e.g., "between" versus "directly between", "adjacent" versus "directly adjacent", etc.).

The terminology used herein is for the purpose of describing example embodiments only and is not intended to be limiting of the example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

A method of programming a NAND flash memory device according to an example embodiment is characterized in that program and verify operation may be performed on one page while a program and verify operation are performed on another page. For example, a plurality of pages is determined as a program unit. A program voltage may then be sequentially applied to each of the determined pages. Thereafter, a verify voltage and a program voltage may be sequentially applied to one page. The above described method may be sequentially performed on the plurality of pages.

According to another example embodiment of a method of programming a NAND flash memory device, a plurality of pages are determined as a program unit. Moreover, a program voltage may be sequentially applied to the determined pages. A verify voltage may then be sequentially applied to the plurality of pages. For example, a plurality of pages of a programming unit may be programmed before a verification of any of the programmed pages is verified.

According to an example embodiment of a method of programming a NAND flash memory device, a time interval or duration exists between a program operation and a verify operation of one page. During this time interval, a threshold voltage of a memory cell becomes stable.

Hereinafter, example embodiments are described in more detail with reference to the accompanying drawings so that this disclosure is thorough and complete and also fully conveys the scope of this disclosure to those skilled in the art.

Figure 1:
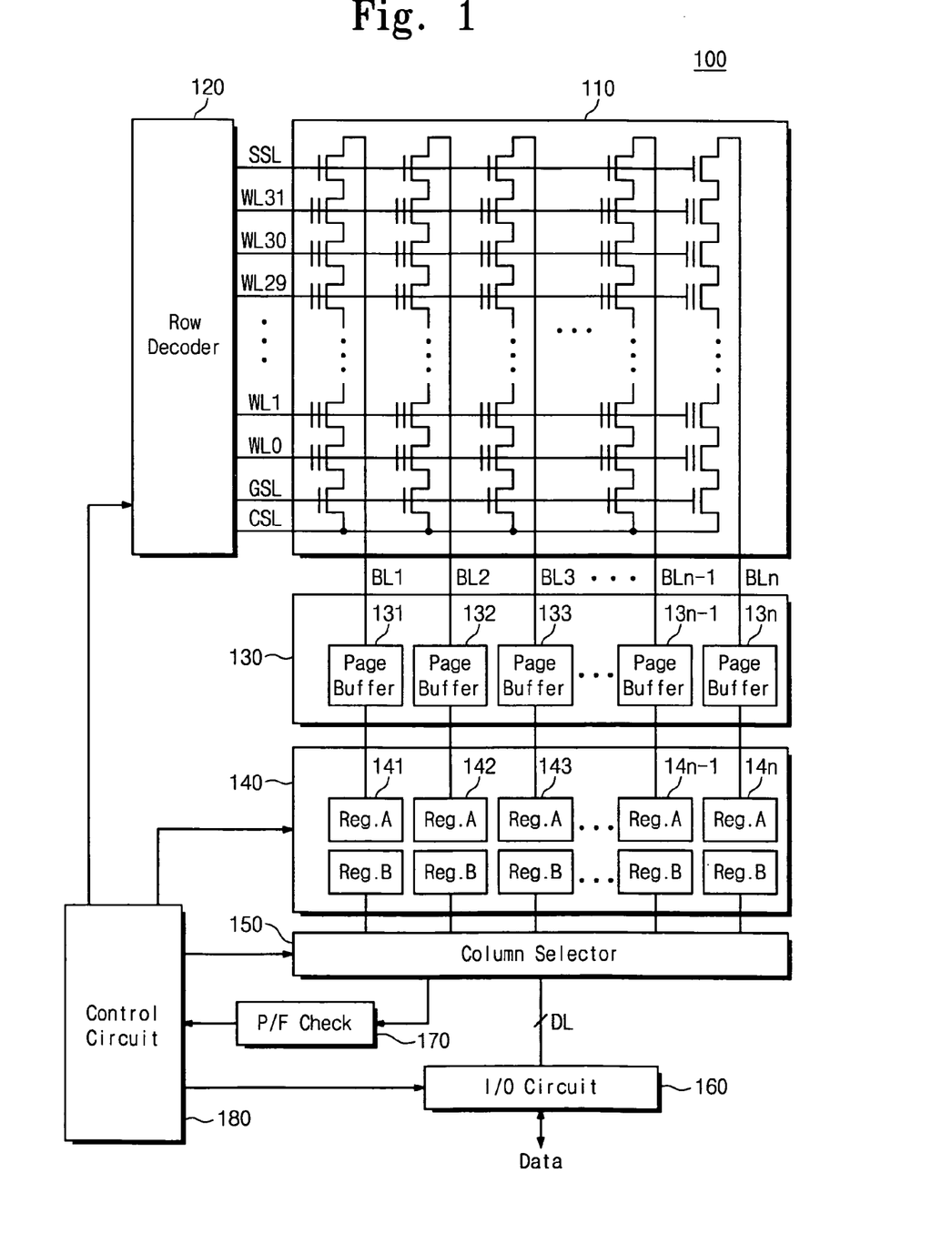
FIG. 1 is a block diagram of a NAND flash memory device according to an example embodiment.

FIG. 1 is a block diagram of an example embodiment of a NAND flash memory device 100. Referring to FIG. 1, the NAND flash memory device 100 includes a cell array 110, a row decoder 120, a page buffer 130, a register 140, a column selector 150, an input/output (I/O) circuit 160, a pass/fail (P/F) check 170, and a control circuit 180.

The cell array 110 includes a plurality of memory blocks. One of the memory blocks is shown in FIG. 1. Each memory block includes a plurality of pages, and each page includes a plurality of memory cells. For example, in the NAND flash memory device 100, the memory block is an erasable unit, and the page is a readable and programmable unit.

On the other hand, each memory block may include a plurality of cell strings. Each cell string may include a ground selection transistor, a plurality of memory cells, and a string selection transistor. In FIG. 1, the ground selection transistor is connected to a ground selection line GSL, the memory cells are connected to word lines WL0 to WL31, and the string selection transistor is connected to a string selection line SSL. A cell string is connected between a corresponding bit line (e.g., BL1) and the common source line CSL.

Referring to FIG. 1, the row decoder 120 is connected to the cell array 110 and the control circuit 180. For example, the row decoder 120 may select the word lines WL0 to WL31 of the cell array 110 according to a control of the control circuit 180.

The page buffer 130 is connected to the cell array 110 and the register 140. The page buffer 130 may store data delivered from the register 140 and data delivered from the cell array 110. In FIG. 1, the page buffer 130 includes a plurality of page buffer units 131 to 13n. The page buffer units 131 to 13n are respectively connected to the bit lines BL1 to BLn of the cell array 110 and the register units 141 to 14n of the register 140.

The register 140 is connected to the page buffer 130, the column selector 150, and the control circuit 180. The register 140 may be controlled by the control circuit 180. The register 140 may store data delivered from the column selector 150 and may deliver the stored data to the page buffer 130. The register 140 includes a plurality of register units 141 to 14n. The register units 141 to 14n are respectively connected to the page buffer units 131 to 13n of the page buffer 140. Each of the register units 141 to 14n may include a plurality of registers. For example, as illustrated in FIG. 1, each of the register units 141 to 14n has two registers Reg. A and Reg. B.

The column selector 150 is connected to the register 140, the I/O circuit 160, the P/F check 170, and the control circuit 180. The column selector 150 may be controlled by the control circuit 180. The column selector 150 may select the register units 141 to 14n and the page buffer units 131 to 13n. The column selector 150 may deliver program data or read data from the cell array 110 via a path of the selected register 140 and the page buffer 130, for example.

The I/O circuit 160 is connected to the column selector 150 and the control circuit 180. The I/O circuit 160 may be controlled by the control circuit 180. The I/O circuit 160 is connected to the column selector 150 and the control circuit 180. The I/O circuit 160 may be controlled by the control circuit 180. The I/O circuit 160 may receive data from an external source and/or device and may deliver the received data to the column selector 150. Moreover, the I/O circuit 160 may deliver data from the column selector 150 to the external source and/or device.

Still referring to FIG. 1, the P/F check 170 is connected to the column selector 150 and the control circuit 180. The P/F check 170 may be controlled by the control circuit 180. When a verifying operation is performed, the P/F check 170 may determine whether a programmed memory cell is determined as passing the verifying operation or failing the verifying operation.

The control circuit 180 is connected to the row decoder 120, the column selector 150, the I/O circuit 160, and the P/F check 170. The control circuit 180 may determine whether all the programmed pages pass or fail the verifying operation. The control circuit 180 may includes a storage device. The storage device may store information about whether each programmed page was determined as passing the verifying operation or failing the verifying operation. Moreover, the control circuit 180 controls general operations of the NAND flash memory device 100 in order to allow a program operation of the cell array 110 to be performed according to an example embodiment of a method as described herein.

According to an example embodiment, a NAND flash memory device 100 performs a program operation of a plurality of pages. In order to program the plurality of pages, program data of each page is stored in a page buffer. However, a relatively long time interval or duration may be used and/or required for delivering the program data of each page from the external source and/or device to the page buffer 130. One reason for the long time period or duration is that, conventionally, the data inputted from the external source and/or device are sequentially inputted 8 bits at a time and the page buffer stores 512 bytes.

According to an example embodiment, the NAND flash memory device 100 includes the register 140 in order to reduce a time interval or duration for data input. If the register 140 is used, a program operation may be substantially, simultaneously performed while data are being delivered from the external source and/or device.

For example, a corresponding page may be programmed based on the data stored in a register, e.g., Reg. A of the register 140, while the data delivered from the external source and/or device is being stored in another register, e.g., Reg. B of the register 140. Then, a corresponding page may be programmed based on the stored data in the Reg. B, while data of the next page is being delivered from the external source and/or device into Reg. A. That is, according to example embodiments, there is no need to wait until all the data are inputted. Accordingly, since a plurality of pages may be programmed during a same time period, an increased number of pages may be programmed.

As shown in FIG. 1, each of the register units 141 to 14n includes two registers. However, it is apparent that the number of registers constituting each of the register units 141 to 14n may vary according to characteristics and purposes of a flash memory device.

Figure 2:
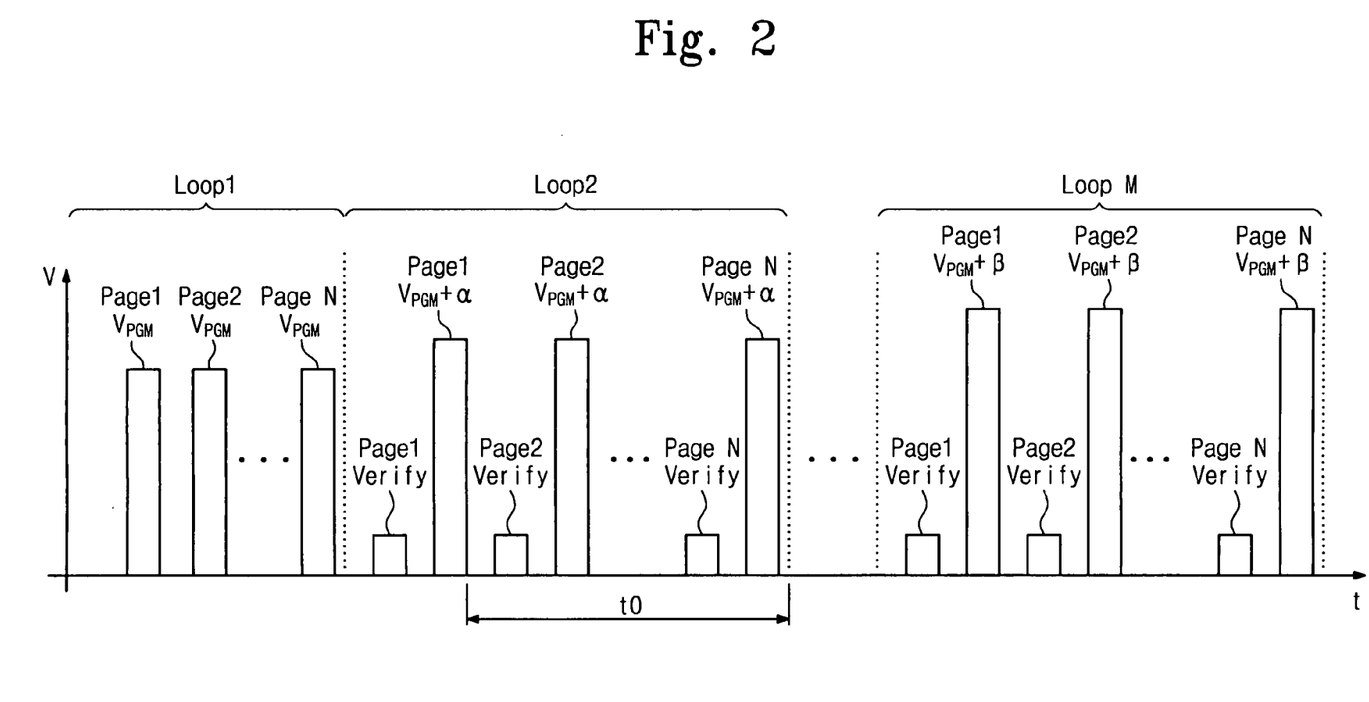
FIG. 2 is illustrates an example embodiment of a program method for the NAND flash memory device of FIG. 1.

FIG. 2 is a view illustrating an example embodiment of a method of programming the NAND flash memory device 100 of FIG. 1. Referring to FIG. 2, the programming of a plurality of pages is divided into loop units. For example, in a first loop Loop1, a program voltage $V_{PGM}$ may be sequentially applied to pages. According to an example embodiment, a plurality of pages Page1 to PageN are sequentially programmed without verifying the programmed pages during the first loop Loop1. Referring to FIG. 2, a program voltage $V_{PGM}$ is sequentially applied from a first page Loop1 to an $N^{th}$ page PageN.

During a second loop Loop2, verify and program operations may be sequentially performed on each page. For example, a program voltage $V_{PGM}+\alpha$ may be applied to the memory cell that is higher than the program voltage $V_{PGM}$ of the previous loop. Also, a second page may be verified and then programmed according to the verification result. This process may be sequentially performed on a plurality of pages. Through the same method, after programming a first page, a time period t0 occurs before the last page is programmed.

An operation performed in the second loop Loop2 may be repeated until all the pages are determined to have passed the verifying operation according to an example embodiment. As shown in FIG. 2, a program loop repeats until an $M^{th}$ loop loopM.

Hereinafter, a program operation repeating from the second loop Loop2 to the $M^{th}$ loop (LoopM) is referred to as repeat loop method. An operation for programming a plurality of pages by a loop unit according to example embodiments is referred to as a loop operation. Moreover, pages to be loop programmed are referred to as loop pages.

If a repeat loop method is used, there is a time interval or duration t0 until a verify operation is performed following programming a memory cell. For example, a first page programmed in a second loop Loop2 is verified in a third loop Loop3. A time interval or period for verify and program operations of other pages may be t0. That is, after a program voltage is applied to the first page, there exists the time interval t0 until a verify voltage is applied.

A threshold voltage of a programmed memory cell becomes stable after a time interval or duration t0 following the programming of the memory cell. The time period t0 is determined as a time period for a threshold voltage of a memory cell to become sufficiently stable following programming of the memory cell such that errors may be reduced and/or eliminated during a verifying operation.

The time period t0 may be determined and/or affected by the number of pages to be programmed in one loop. For example, the number of loop pages is determined to allow the time period t0 to be greater than or equal to a time period for stabilization of a threshold voltage following a programming operation.

Figure 3:
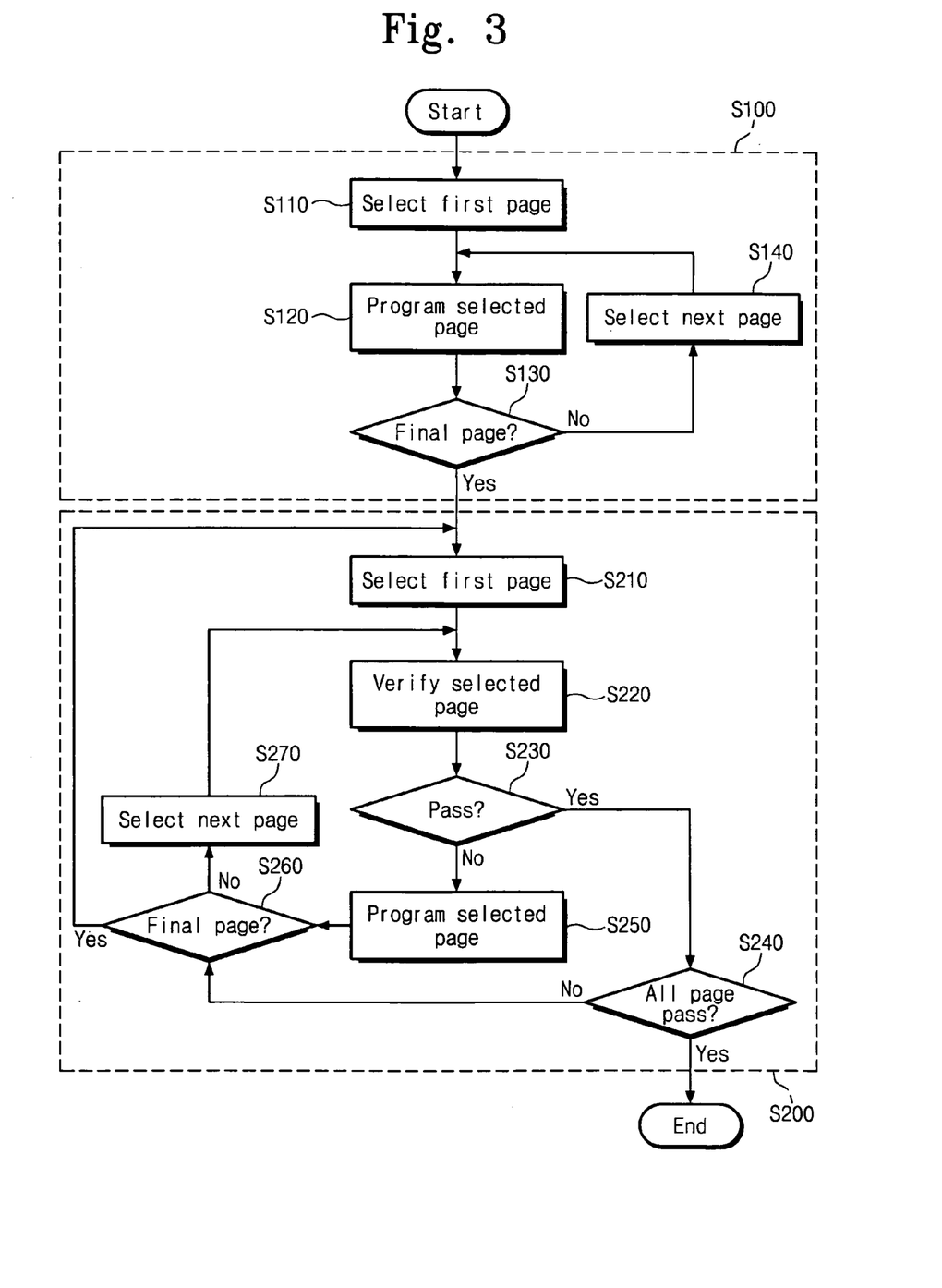
FIG. 3 is a flowchart illustrating an example embodiment of the program method of FIG. 2.

FIG. 3 is a flowchart illustrating the program operation of FIG. 2. Referring to FIG. 3, the program operation is divided into operation S100 and operation S200. Operation S100 is a program operation of a first loop Loop1 of FIG. 2. Operation S200 is a repeat loop method corresponding to the second loop Loop2 to the $M^{th}$ loop LoopM of FIG. 2.

The program operation S100 includes operations S110 to S130. In operation S110, a first page among pages to be programmed is selected. In operation S120, the selected page is programmed. In operation S130, it is determined whether the selected page is the last page among the loop pages. If the selected page is the last page, a repeat loop method operation S200 is performed. If the selected page is not the last page, the program operation proceeds to operation S140. In operation S140, the next page is selected and then operations S120 to S140 are repeated. That is, all the loop pages are sequentially programmed one by one in operation S100. According to an example embodiment shown in FIG. 3, the operation S100 does not include a verifying operation.

Still referring to FIG. 3, operation S200 is repeat loop method according to an example embodiment and includes operations S210 to S270. In operation S210, a first page is selected from the loop pages. In operation S220, the selected page is verified.

In operation S230, it is determined whether the selected page is determined as passing the verifying operation or failing the verifying operation. If the selected memory page passes the verifying operation, the method proceeds to operation S240. In operation S240, if all the loop pages pass the verifying operation, the current loop is terminated. If there is a page that fails the verifying operation among the loop pages, the method proceeds to operation S260. This determining operation may be performed in the control circuit 180 of FIG. 1, for example. Whether each loop page passes the verifying operation or not may be stored in a storage device of the control circuit 180. The control circuit 180 determines whether all the loop pages pass or fail the verifying operation based on data stored in the storage device, for example.

In operation S230, if the selected page is determined to fail the verifying operation, the method proceeds to operation S250. In operation S250, the selected page is programmed. The method then proceeds to operation 260.

In operation S260, it is determined whether the selected page is the last page among the loop pages. If the selected page is not the last page, the next page is selected in operation S270 and the method proceeds to operation S220. If the selected page is the last page, the first page of another loop may be selected in operation S210. In operations S220 to S270, verifying and programming operations may be repeatedly performed on the selected page.

In brief, one page is selected and the selected page is verified in operation S200 representing the repeat loop method. If the verification result indicates the selected page passes the verifying operation, the next page is selected without an additional operation. If the verification result indicates the selected page has failed the verifying operation, a program operation may be performed on the selected page, and the next page may be selected. The repeat loop method repeats until all of the loop pages are indicated as passing the verifying operation. During the loop program operation, a program voltage may be incrementally increased each time one loop is performed.

The loop programming of the pages may be to perform a verify operation after a threshold voltage of a memory cell becomes sufficiently stable. However, if a passing the verifying operation is excluded from a loop programming operation, a time for one loop is not used or required. That is, a loop programming operation time may be insufficient. Stated differently, a threshold voltage of a memory cell may not have sufficient time to become stable if pages that have passed the verifying operation are removed from the loop. If a page passing the verifying operation is removed from the loop, verifying and/or program errors may occur. To reduce and/or prevent these possible errors, a loop program operation may be repeatedly performed on pages that have passed the verifying operation as long as one page in the loop has failed the verifying operation.

As mentioned above, each memory cell may be verified once a time period lapses after programming. That is, a verify operation may be performed after a threshold voltage of a memory cell becomes stable. Therefore, verify and program errors due to an unstable threshold voltage may be reduced and/or prevented according to example embodiments.

Figure 4:
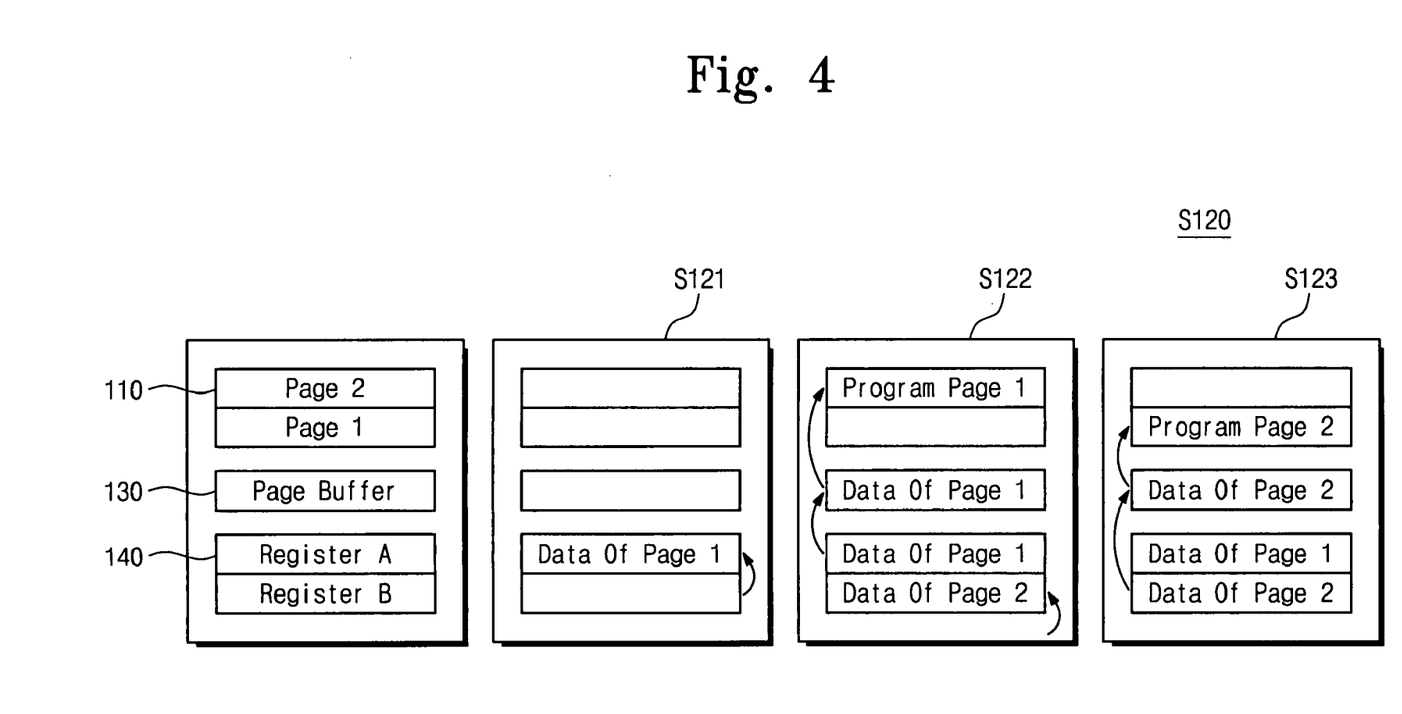
FIG. 4 is a view illustrating an example register operation of the NAND flash memory device of FIG. 1 during a program operation of the program method of FIG. 3.

FIG. 4 is a block diagram illustrating an example operation of the register 140 of the memory device 100 of FIG. 1 during a program operation of FIG. 3. Referring to FIG. 4, operation S120 of FIG. 3 will be described (e.g., an operation where a selected page is programmed using two pages of the cell array 110, the page buffer 130, and the resister 140 in FIG. 1). The arrows of FIG. 4 indicate data flow. In FIG. 4, it is assumed that the number of loop pages to be programmed is two, and each of register units 141-14n of FIG. 1 includes two registers.

Referring to FIG. 4, data of a first page are delivered to the register A in operation S121. In operation S122, data of a second page are delivered to the register B. The data of the first page stored in the register A may be delivered to the page buffer. For example, the data of the first page stored in the register A may be delivered to the page buffer simultaneously with the data of a second page being delivered to the register B. Additionally, the first page may be programmed based on the data stored in the page buffer.

In operation S123, the data of the second page stored in the register B may be delivered to the page buffer. Moreover, the second page may be programmed based on the data stored in the page buffer.

Then, a repeat loop method may be performed. If the first page is verified and programmed during a repeat loop method, the data of the first page stored in the register A may be delivered to the page buffer. If the second page is verified and programmed, the data of the second page stored in the register B may be delivered to the page buffer.

One register may deliver data to the page buffer to perform a program operation of a corresponding page. Another register may receive data of a page to be programmed from an external source and/or device while the one register delivers data to the page buffer to perform the program operation of the corresponding page. Moreover, when all the data of each loop page are stored in the registers, data of a page to be verified and programmed may be delivered from the registers to the page buffer.

If there is no register, data of an 8 bit unit may be sequentially delivered to the page buffer of 512 bytes. However, data may be delivered from the register of 512 bytes to the page buffer of 512 bytes is there is a register. Moreover, one register may receive data from the external source and/or device, and another register may substantially simultaneously deliver data for a program operation to the page buffer. Accordingly, if a register is used, a wait time for receiving data from the external source and/or device may be reduced. That is, after one page is programmed, a time for programming another page may be reduced according to an example embodiment. As a result, an increased number of pages may be loop programmed during the loop program operation according to example embodiments as compared with conventional techniques.

According to another example embodiment, the number of registers may be different from the number of loop pages. If the number of registers is greater than the number of loop pages, an example embodiment of a method illustrated in FIG. 4 may be implemented.

Figure 5:
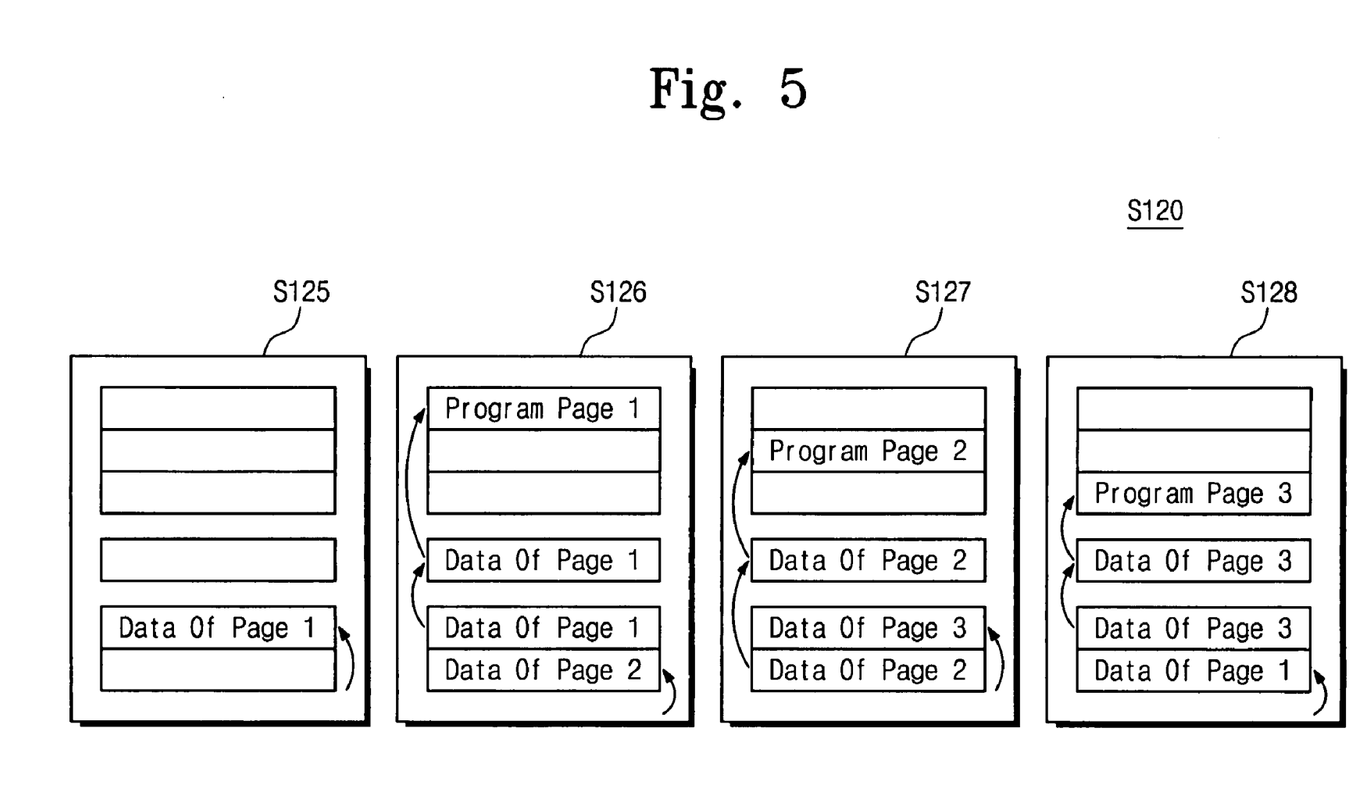
FIG. 5 is a view illustrating an example register operation of the NAND flash memory device of FIG. 1 during a program operation of the program method of FIG. 3.

FIG. 5 is a block diagram illustrating an operation of the register 140 of the memory device 100 in FIG. 1 during the program operation of FIG. 3. Similar to FIG. 4, FIG. 5 illustrates operation S120 of FIG. 3 where a selected page is programmed using three pages among the cell array 110, the page buffer 130, and the register 140 in FIG. 1. Arrows of FIG. 5 represent data flow. In FIG. 5, it is assumed that the number of loop pages to be programmed is three, and each of the register units 141 to 14n has two registers.

Referring to FIG. 5, data of a first page may be delivered from an external source and/or device to the register A in operation S125. In operation S126, data of a second page may be delivered from the external source and/or device to the register B. Simultaneously, the data of the first page stored in the register A may be delivered to the page buffer. The first page may be programmed based on the data stored in the page buffer.

In operation S127, data of a third page may be delivered from the external source and/or device to the register A. Simultaneously, the data of the second page stored in the register B may be delivered to the page buffer. Moreover, the second page may be programmed based on the data stored in the page buffer.

In operation S128, the data of a first page may be delivered from the external source and/or device to the register B. Simultaneously, the data of the third page stored in the register A may be delivered to the page buffer. Moreover, the third page may be programmed based on the data stored in the page buffer.

Thereafter, a repeat loop method may be performed. For example, if the first page is verified and programmed in the repeat loop method, data of the first page stored in the register B may be delivered to the page buffer. Simultaneously, data of the second page used and/or required for verifying and programming operations of the next page may be delivered from the external source and/or device to the register A.

When the second page is verified and programmed, data of the second page stored in the register B may be delivered to the page buffer. Simultaneously, data of the third page used and/or required for verifying and programming operations of the next page may be delivered from the external source and/or device to the register B.

When the third page is verified and programmed, data of the third page stored in the register B may be delivered to the page buffer. Simultaneously, data of a first page used and/or required for verifying and programming operations of the next page may be delivered from the external to the register A.

For example, one register delivers data to the page buffer in order to perform verifying and programming operations of a corresponding page, while another register receives data of a page to be verified and programmed for the next page. The next page may be received from the external source and/or device.

If there is no register, data of an 8 bit unit may be sequentially delivered to the page buffer of 512 bytes. However, data may be delivered from the register of 512 bytes to the page buffer of 512 bytes if a register is used. Moreover, one register may receive data from the external source and/or device and another register may deliver data for a programming operation to the page buffer. These operations may be performed substantially simultaneously. Accordingly, if the register is used, a wait time for receiving data from the external may be reduced. That is, after one page is programmed, a required time for programming another page may be reduced. As a result, according to an example embodiment, an increased number of pages may be loop programmed during the loop program operation as compared to conventional techniques.

According to another example embodiment, the number of pages to be programmed may be less than the number of loop pages that a loop program operation uses and/or requires. For example, a situation may occur in which only three pages to be programmed exist in a memory block, but five loop pages are used and/or required so that a program operation of one loop can be performed to allow a threshold voltage to be stable. In this case, one or more virtual pages may be used and/or applied. For example, assuming that there are two pages that pass a verifying operation. A loop program may be performed on the total five pages including the three virtual pages. For the virtual pages, only data loading and a verify operation are performed. A program operation is not performed on the virtual pages and the virtual pages may always pass the verifying operation according to an example embodiment. Therefore, the desired and/or required number of loop pages may be satisfied without affecting a loop program operation.

In the above-mentioned example embodiments, each page is programmed using a loop program operation. However, the programming of the flash memory device may be done with a typical program method along with a loop method according to an example embodiment.

First, a lower voltage (e.g., 0 V) than a threshold voltage (e.g., 0.7 V) associated with a programmed memory cell may be determined as a verify voltage. Moreover, a memory cell may be programmed using a typical method based on the determined verify voltage. At this point, threshold voltages of memory cells may be distributed around 0 V. Later, the original threshold voltage (e.g., 0.7 V) may be determined as a verify voltage and a memory cell may be programmed using a loop method according to an example embodiment. As such, the programming of the memory cell according to an example embodiment may include a typical program method as well as a loop method.

In the above-described example embodiments, a program operation is performed based on data stored in a first register. Further, data delivered from an external source and/or device may be stored in another register while a programming operation is performed on the data stored in the first register. However, if the number of registers is greater than or equal to the number of loop pages, another method may be used. After all the program data of loop pages are stored in the registers, the programming of a memory cell may be performed.

An example embodiment of a method for programming may be applied to the programming of a multi level cell (MLC). For example, a least significant bit (LSB) may be loop programmed, and a most significant bit (MSB) may be loop programmed based on data programmed with an LSB and data to be programmed with an MSB. The programming order of the LSB and MSB is reversible. Through this method, verify and program errors due to an unstable threshold voltage may be reduced and/or prevented in the MLC.

In the above-mentioned embodiment, verifying and programming operations of each loop page may be sequentially performed in a repeat loop method. Alternatively, the loop program operation may be done with another method.

Figure 6:
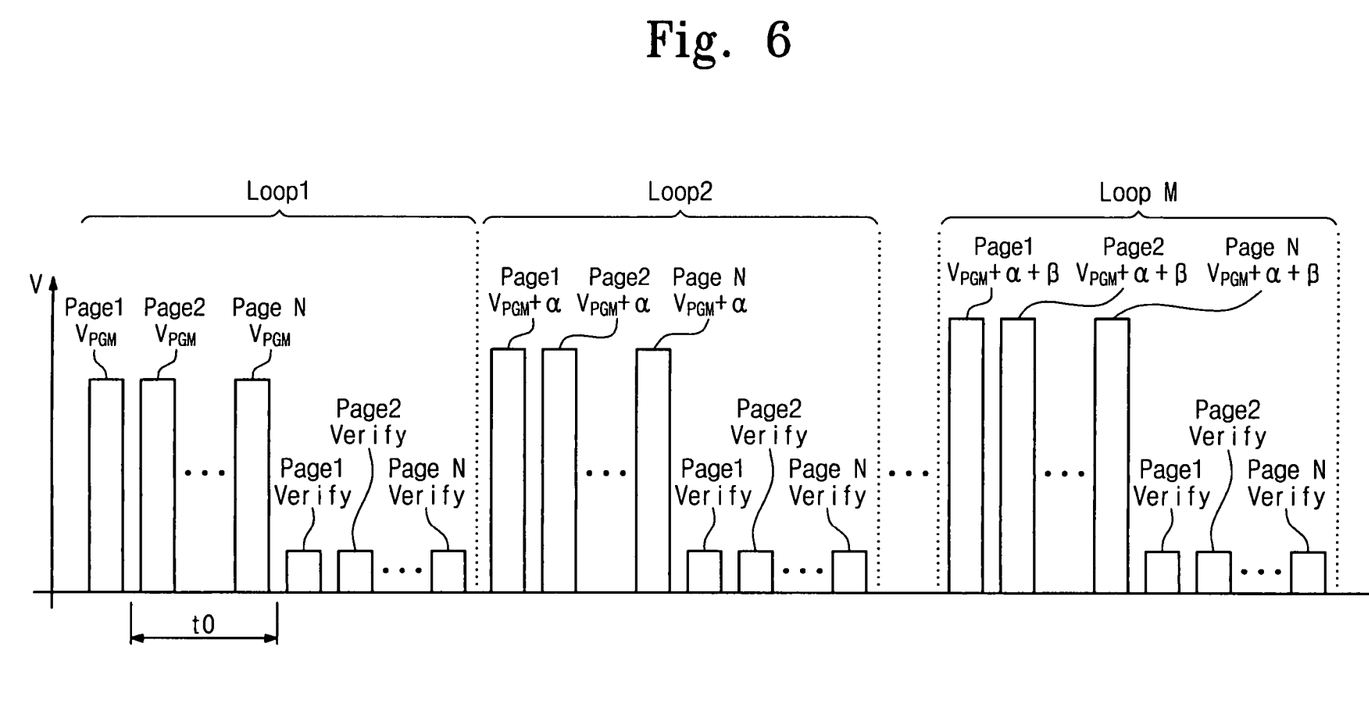
FIG. 6 is a view illustrating another example embodiment of a program method.

FIG. 6 is a view illustrating a program method according to an example embodiment. Referring to FIG. 6, the programming of pages is divided into loop units. For example, during a first loop Loop1, a program voltage $V_{PGM}$ may be sequentially applied to a plurality of pages. In FIG. 6, the program voltage $V_{PGM}$ is sequentially applied from a first page Page1 to an $N^{th}$ page PageN. A verify voltage is sequentially applied to a plurality of pages. However, it is noted that in each loop of the example embodiment shown in FIG. 6, a plurality of pages are programmed before programming of any of the pages in each loop are verified.

In a second loop Loop2, a plurality of pages may be programmed and then verified. However, a program voltage $V_{PGM}+\alpha$ may be used in the second loop Loop2 that is higher than the program voltage $V_{PGM}$ of the first loop Loop1. Through this method, loops repeat until all the loop pages are determined to pass a verifying operation. In FIG. 6, the method may repeat until $M^{th}$ loop LoopM is programmed and verified.

If a loop program method is used, there is a time interval of t0 that elapses after programming of a memory cell until a verifying operation is performed for the memory cell. That is, a threshold voltage of a programmed memory cell may require a time interval or duration of t0 before the threshold voltage of the programmed memory cell stabilizes. If the time period t0 is determined as a time in which a threshold voltage of a memory cell is sufficiently stabilized, errors occurring during a verifying operation stemming from a insufficiently stabilized threshold voltage may be reduced and/or prevented. Accordingly, the time interval or duration t0 may be determined as a time interval or duration sufficient for a threshold voltage of a memory cell to stabilize. Moreover, the number of loop pages may be determined based on the time interval or duration t0.

Figure 7:
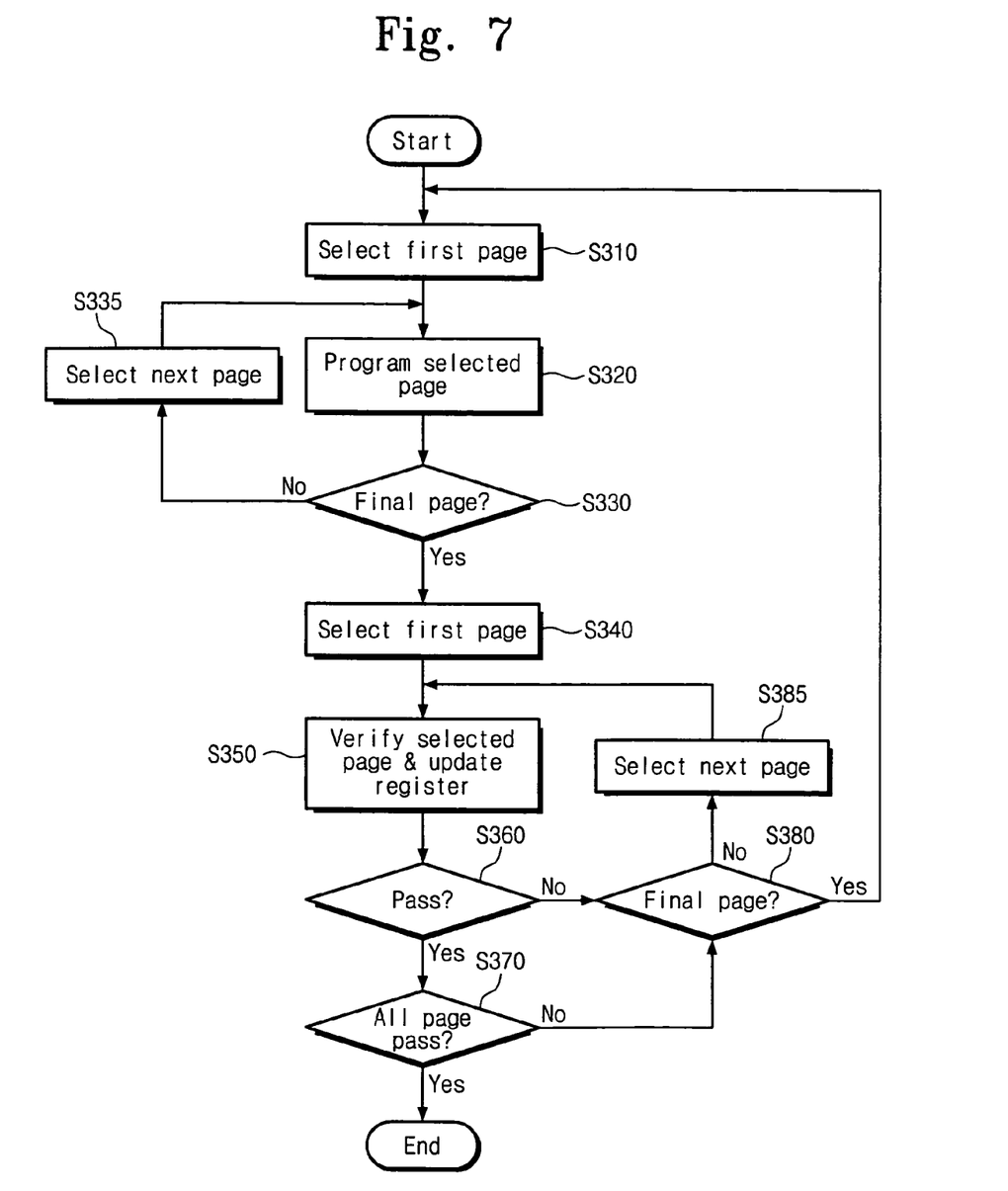
FIG. 7 is a flowchart illustrating an example program operation of the program method of FIG. 6.

FIG. 7 is a flowchart illustrating the programming operation of FIG. 6. Referring to FIG. 7, a first page may be selected from loop pages in operation S310. Then, the selected page may be programmed in operation S320.

In operation S330, it is determined whether the selected page is the last page among the loop pages. If the selected page is the last page, the method proceeds to operation S340. If the selected page is not the last page, the next page is selected in operation S335. Then, operations S320 to S335 may be repeated. Operations S320 to S335 repeat until the last page is programmed according to an example embodiment. That is, all the loop pages are sequentially programmed.

In operation S340, the first page may be selected again. In operation S350, the selected page is verified. Then, the verification result may be stored in the register 140 of FIG. 1.

In operation S360, it is determined whether the selected page is determined to have passed the verifying operation. If the selected page passes the verifying operation, the method proceeds to operation S370. In operation S370, it is determined whether all the loop pages have passed the verifying operation. If all the loop pages are determined to have passed the verifying operation, the programming operation may be terminated. If there is a page that failed the verifying operation, the method proceeds to operation S380. This determination operation may be performed in the control circuit 180 of FIG. 1. Whether each loop page is determined to have passed or failed the verifying operation may be stored in a storage device of the control circuit 180. The control circuit 180 may determine whether all the loop pages have passed verifying operation based on the data stored in the storage device.

In operation S360, if the selected page is determined to have failed the verifying operation, the method proceeds to operation S380. In operation S380, it is determined whether the selected page is the last page among the loop pages. If the selected page is the last page, the method proceeds to operation S310. If the selected page is not the last page, the next page is selected in operation S385. Then, the method proceeds to operation S350.

In brief, the loop pages may be sequentially verified. During this process, if all the pages are determined to have passed the verifying operation, the loop program may be terminated. The verification result may be stored in the register. Moreover, if the verification of the last page is completed, the loop pages may be sequentially programmed again. A program operation may be performed based on data stored in a register.

Through the above-described example embodiment of a method, each loop page may be sequentially programmed, and then, a loop program may be performed through a method of sequentially verifying each loop page. During this programming operation, as mentioned in the example embodiment of FIG. 4, one of the registers may receive data of a page to be programmed from an external source and/or device. Further, another register may deliver data of a page to be programmed to a page buffer. The programming operation of one of the registers may be performed simultaneously with the delivery of a page to the page buffer from the external source and/or device. The specifics of the above-mentioned operations may be the same as the example embodiment described with reference to FIG. 2, and thus, a detailed description of these specifics are omitted for conciseness.

In the above-mentioned example embodiments, the NAND flash memory device 100 of FIG. 1 includes a plurality of registers. However, a NAND flash memory device according to another example embodiment may be realized without using a register.

Figure 8:
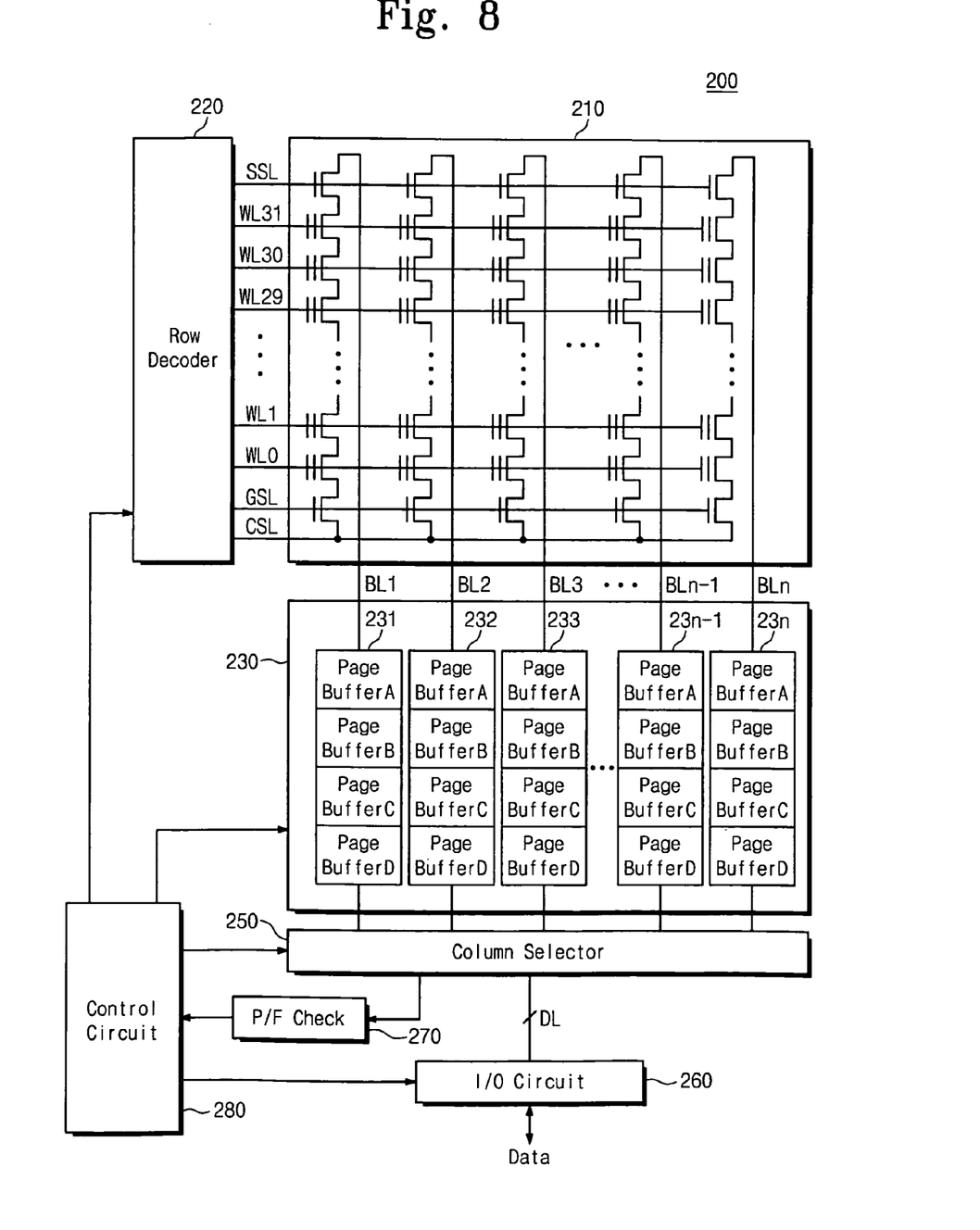
FIG. 8 is a block diagram of a NAND flash memory device according an example embodiment.

FIG. 8 is a block diagram of a NAND flash memory device 200 that does not include a register according to an example embodiment. Referring to FIG. 8, the NAND flash memory device 200 includes a cell array 210, a row decoder 220, a page buffer 230, a column selector 250, an I/O circuit 260, a P/F check 270, and a control circuit 280.

In the NAND flash memory device 200 of FIG. 8, blocks except for the register 140 and the page buffer 130 of FIG. 1 perform the same functions and operations as those previously described with respect to the NAND flash memory device 100 of FIG. 1. Accordingly, the overlapping description is omitted for conciseness.

In the NAND flash memory device 200 of FIG. 8, the page buffer 230 serves as the register 140 of FIG. 1. Stated differently, the page buffer 230 performs operations performed by both the register 140 and the page buffer 130 of the NAND flash memory device 100 described with respect to FIG. 1.

Referring to FIG. 8, the page buffer 230 is connected to the cell array 210 and the column selector 240. The page buffer 230 includes a plurality of page buffer units 231 to 23n. The page buffer units 231 to 23n are respectively connected to the bit lines BL1 to BLn.

Each of the page buffer units 231 to 23n includes page buffers. Each of the page buffer units 231 to 23n includes four page buffers (i.e., Page buffer A to Page buffer D) in FIG. 8. However, it is apparent that the number of page buffers constituting the page buffer units 231 to 23n may vary according to purposes and characteristics of a flash memory device.

In the NAND flash memory device 200 of FIG. 8, a plurality of page buffers 230 may be used for storing data inputted from the external source and/or device and performing a loop programming operation. Storing data inputted and performing the loop programming operation may be performed substantially simultaneously. That is, the plurality of page buffers 230 is used instead of the registers 140 of the NAND flash memory device 100 of FIG. 1. Therefore, the register 140 is replaced with the page buffer 230 when data are received from the external source and/or device according to the example embodiment of the NAND flash memory device 200 of FIG. 8. A process for delivering the data stored in the register 140 to the page buffer 130 of FIG. 1 is replaced with a process for selecting one of the plurality of page buffers 230 according to an example embodiment.

An example embodiment of a program method may be identical to the program method of the NAND flash memory device 100 described with reference to FIG. 1 except that operations performed by the register 140 are now performed by the page buffer 230. Accordingly, a detailed description of the same operations is omitted for conciseness.

Figure 9:
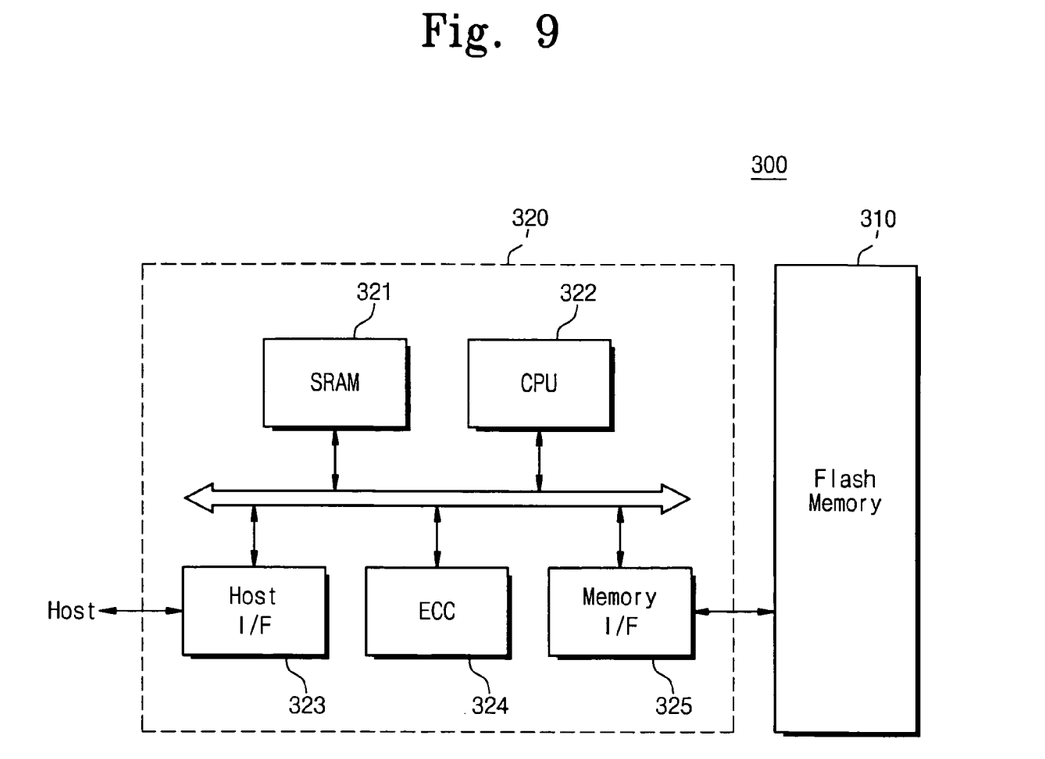
FIG. 9 is a block diagram illustrating a memory card with a flash memory device according to an example embodiment.

FIG. 9 is a block diagram illustrating a memory card with a flash memory device according to an example embodiment. Referring to FIG. 9, a memory card 300 includes an example embodiment of a flash memory device 310 in order to support a high capacity data storage ability. The memory card 300 includes a memory controller 320 controlling general data exchanges between a host and the flash memory device 310. The memory controller includes a SRAM 321, a central processing unit (CPU) 322, a host interface (I/F) 323, a error correction code (ECC) 324, and a memory I/F 325.

The SRAM 321 of the memory controller 320 may be used as an operating memory of the CPU 322. The host interface (I/F) 323 may include a data exchange protocol of a host connected to the memory card 300. The error correction code (ECC) 324 may detect and correct errors in data read from the flash memory device 310. The memory I/F) 325 may interface with the flash memory device 310.

The CPU 322 may perform general control operations for data exchanges of the memory controller 320. Although not illustrated in the drawing, it is apparent to those skilled in the art that the memory card 300 may further include ROM (not shown) for storing code data in order to interface with the host.

Figure 10:
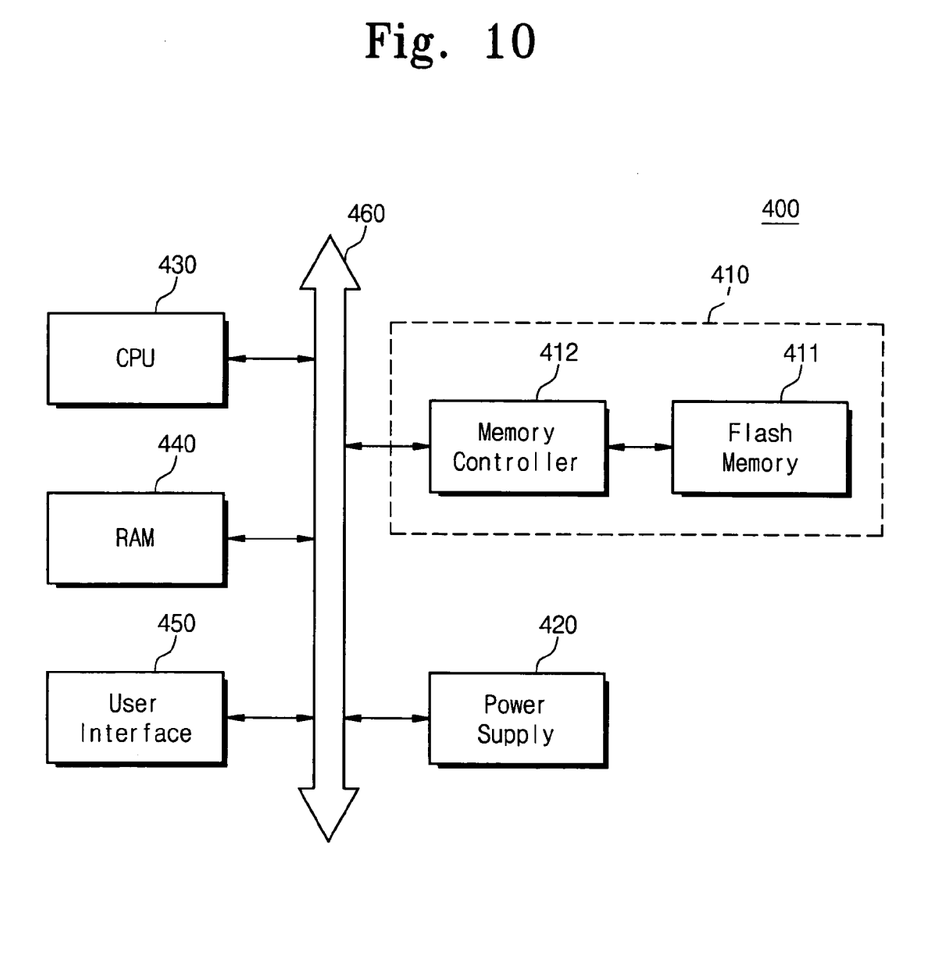
FIG. 10 is a block diagram illustrating a memory system with a flash memory device according to an example embodiment.

FIG. 10 is a block diagram illustrating a memory system with a flash memory device according to an example embodiment. Referring to FIG. 10, a memory system 400 includes a flash memory system 410, a power supply 420, a CPU 430, a RAM 440, a user interface 450, and a system bus 460.

The flash memory system 410 includes a memory controller 412 and a flash memory device 411. The flash memory system 410 may be electrically connected to the power supply 420, the CPU 430, the RAM 440, and the user interface 450 through the system bus 460. Data provided through the user interface 450 and/or processed by the CPU 430 may be stored in the flash memory device 411 through the memory controller 412.

If the flash memory system 410 is mounted as a solid state disk (SSD), a booting speed of the system 400 may be drastically improved. Although not illustrated in the drawings, it is apparent to those skilled in the art that the memory system 400 may further include an application chipset, a camera image processor, etc.

As describe above, the method of programming a NAND flash memory device according to example embodiments is characterized in that program and verify operations may be performed on one page while program and verify operation are being performed on another page. First, a plurality of pages may be determined as a program unit. Then, a program voltage may be sequentially applied to each of the determined pages. Thereafter, a verify voltage and a program voltage may be sequentially applied to one page. This operation may be sequentially performed on the plurality of pages according to an example embodiment.

In another example embodiment of a method of programming a NAND flash memory device, a plurality of pages may be determined as a program unit. Moreover, a program voltage may be sequentially applied to the determined pages. Then, a verify voltage may be sequentially applied to the plurality of pages.

According to an example embodiment of a method of programming a NAND flash memory device, a time interval exists between a program operation and a verify operation of one page. During this time interval, a threshold voltage of a memory cell stabilizes.

According to an example embodiment, when programming a NAND flash memory device, a verify operation is performed after a time interval elapses following the programming a memory cell. Since a verify operation is performed after a threshold voltage of a memory cell is stable, verify and program errors due to an unstable threshold voltage may be reduced and/or prevented. Accordingly, a threshold voltage distribution may be reduced and program characteristics of a NAND flash memory device may be improved according to example embodiments.

The above-disclosed subject matter is to be considered illustrative, and not restrictive, and the appended claims are intended to cover all such modifications, enhancements, and other embodiments, which fall within the true spirit and scope of this disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A NAND flash memory device comprising:
   a cell array including a plurality of pages;
   a page buffer configured to store program data of at least one of the pages;
   a data storage circuit configured to provide program verification data to the page buffer; and
   a control unit configured to program the pages and verify the pages using the program verification data following the programming of at least two of the pages, wherein at least two different pages are programmed and verified.

2. The NAND flash memory device of claim 1, wherein the program data are stored in the page buffer via the data storage circuit.

3. The NAND flash memory device of claim 1, wherein the control unit continuously programs and verifies the programmed pages.

4. The NAND flash memory device of claim 3, wherein the control unit increases a program voltage for programming the pages if a programmed page fails the verifying operation.

5. The NAND flash memory device of claim 3, wherein the program verification data stored in the data storage circuit are updated according to a result of the verification operation.

6. The NAND flash memory device of claim 1, wherein the control unit verifies and programs each of the pages at least one additional time.

7. The NAND flash memory device of claim 6, wherein the control unit increases a program voltage for programming the pages if a programmed page fails the verifying operation.

8. The NAND flash memory device of claim 1, wherein the data storage circuit stores program data inputted from an external source and provides program data to the page buffer simultaneously.

9. The NAND flash memory device of claim 1, wherein the data storage circuit has the same structure as the page buffer.

10. The NAND flash memory device of claim 1, wherein the data storage circuit includes a plurality of registers.

11. A memory system comprising:
    the NAND flash memory device according to claim 1; and
    a memory controller controlling the NAND flash memory device.

12. The NAND flash memory device of claim 1, wherein the control unit is configured to program the at least two different pages without verifying the at least two different pages.

13. The NAND flash memory device of claim 1, wherein the control unit is configured to continuously program the at least two different pages continuously.

14. A method of programming a NAND flash memory device, the method comprising:
    programming a plurality of pages; and
    verifying the programmed pages following the programming of at least two of the plurality of pages, wherein at least two different pages are programmed and verified.

15. The method of claim 14, wherein the verifying of the programmed pages is continuously performed on the pages.

16. The method of claim 14, wherein verifying the programmed pages occurs following a time interval after the programming of a memory cell, the time interval is longer than a time interval for a threshold voltage of the programmed memory cell to stabilize.

17. The method of claim 16, wherein a number of the plurality of pages is determined based on the time interval for the threshold voltage of the programmed memory cell to stabilize.

18. The method of claim 17, wherein the pages include at least one virtual page that is determined to pass the verification.

19. The method of claim 14, further comprising:
    increasing a program voltage for programming the pages if a programmed page fails the verifying operation; and
    repeating the programming of the pages and the verifying operation.

20. The method of claim 19, wherein repeating the programming of the pages repeats the programming of at least one page that has passed the verifying operation.

21. The method of claim 14, wherein the programming programs a most significant bit and a least significant bit of a multi level cell.

22. The method of claim 14, further comprising:
    determining a first voltage that is lower than a threshold voltage associated with a programmed memory cell;
    verifying the programmed memory cell with the determined first verify voltage;
    determining a second voltage that is equal to or greater than a sum of a programming voltage used to program the plurality of pages and the first voltage; and
    repeatedly programming the pages with the second voltage.

23. The method of claim 14, wherein the programming programs the at least two different pages without verification.

24. The method of claim 14, wherein the programming programs the at least two different pages continuously.

* * * * *